(12) United States Patent
Eydelman

(10) Patent No.: US 6,636,040 B1
(45) Date of Patent: Oct. 21, 2003

(54) MRI ANTENNA

(75) Inventor: Gregory Eydelman, West Hempstead, NY (US)

(73) Assignee: Fonar Corporation, Melville, NY (US)

(*) Notice: Subject to any disclaimer, the term of this patent is extended or adjusted under 35 U.S.C. 154(b) by 320 days.

(21) Appl. No.: 09/738,236

(22) Filed: Dec. 15, 2000

Related U.S. Application Data

(60) Provisional application No. 60/172,199, filed on Dec. 17, 1999.

(51) Int. Cl.[7] .................................................. G01V 3/00
(52) U.S. Cl. ..................................................... 324/318
(58) Field of Search ................................ 324/307, 309, 324/318, 322

(56) References Cited

U.S. PATENT DOCUMENTS

| | | |
|---|---|---|
| 3,902,177 A | 8/1975 | Mori et al. |
| 4,083,006 A | 4/1978 | Yokoshima |
| 4,373,163 A | 2/1983 | Vandebult |

(List continued on next page.)

OTHER PUBLICATIONS

Gary X. Shen, et al., "Experimentally Verified, Theoretical Design of Dual–Tuned, Low–Pass Birdcage Radiofrequency Resonators for Magnetic Resonance Imaging and Magnetic Resonance Spectroscopy of Human Brain at 3.0 Tesla", Magnetic Resonance In Medicine, vol. 41, No. 2, pp. 268–275, 1999.

(List continued on next page.)

*Primary Examiner*—Diego Gutierrez
*Assistant Examiner*—Dixomara Vargas
(74) *Attorney, Agent, or Firm*—Brandon N. Sklar; Kaye Scholer, LLP

(57) ABSTRACT

An MRI antenna is disclosed comprising a first coaxial cable unit comprising a first inner conductor with first and second ends and a first outer conductor substantially surrounding the inner conductor. The first outer conductor has first and second ends. The first coaxial cable unit has a concave curvature facing a first direction. A second coaxial cable unit is provided comprising an inner conductor with first and second ends and an outer conductor substantially surrounding the inner conductor. The outer conductor has first and second ends and the second coaxial cable unit has a concave curvature facing a second direction opposite the first direction. The concave curvature of the first and second coaxial cable units generally face each other to define a region for receiving a body part. The first end of the first inner conductor is connected to the first end of the second inner conductor through a first capacitor. The first end of the first outer conductor is connected to the first end of the second outer conductor through a second capacitor. The second end of the first inner conductor and the second end of the second inner conductor are not connected to each other and the second end of the first outer conductor and the second end of the second outer conductor are not connected to each other. The first and second outer conductor provide an output of the antenna. Additional coaxial cable units may be electrically connected to the first or second coaxial cable units. An antenna array of five coaxial cable units is disclosed for imaging the lumbar spine. Transmitting antennas and magnetic resonance imaging systems are also disclosed.

46 Claims, 12 Drawing Sheets

U.S. PATENT DOCUMENTS

| | | | |
|---|---|---|---|
| 4,605,899 A | | 8/1986 | Eumurian et al. |
| 4,691,163 A | * | 9/1987 | Blass et al. .................. 324/318 |
| 4,725,781 A | | 2/1988 | Roschmann |
| 4,775,837 A | | 10/1988 | Roschmann |
| 4,816,766 A | | 3/1989 | Zabel et al. |
| 4,820,985 A | | 4/1989 | Eash |
| 4,833,409 A | | 5/1989 | Eash |
| 4,835,472 A | | 5/1989 | Zabel et al. |
| 4,839,594 A | | 6/1989 | Misic et al. |
| 4,859,950 A | * | 8/1989 | Keren ......................... 324/322 |
| 4,887,038 A | | 12/1989 | Votruba et al. |
| 4,922,204 A | | 5/1990 | Duerr et al. |
| 5,006,805 A | * | 4/1991 | Ingwersen .................. 324/322 |
| 5,050,605 A | | 9/1991 | Eydelman et al. |
| 5,053,711 A | | 10/1991 | Hayes et al. |
| 5,184,076 A | | 2/1993 | Ehnholm |
| 5,363,113 A | * | 11/1994 | Mametsa et al. ........... 343/744 |
| 5,575,287 A | | 11/1996 | Eydelman |
| 5,583,438 A | | 12/1996 | Eydelman et al. |
| 5,606,259 A | | 2/1997 | Potthast et al. |
| 5,939,883 A | | 8/1999 | Green et al. |
| 6,023,166 A | | 2/2000 | Eydelman |
| 6,025,717 A | | 2/2000 | Hertz et al. |
| 6,028,429 A | | 2/2000 | Green et al. |
| 6,107,974 A | | 8/2000 | Votruba et al. |
| 6,137,291 A | | 10/2000 | Szumowski et al. |
| 6,284,971 B1 | | 9/2001 | Atalar et al. |

OTHER PUBLICATIONS

P. Elies et al., "Analytical Optimization of the Torque of a Permanent–Magnet Coaxial Synchronous Coupling", IEEE Transactions on Magnetics, vol. 34, No. 4, pp. 2267–2273, Jul. 1998.

Jeffrey R. Fitzsimmons, et al., "Double Resonant Quadrature Birdcage", Magnetic Resonance in Medicine, vol. 30, pp. 107–114, 1993.

Siew Kan, et al., "Single–Input Double–Tuned Foster–Type Probe Circuit", Magnetic Resonance in Medicine vol. 26, pp. 7–14, 1992.

K. Derby, et al., "Design and Evaluation of a Novel Dual–Tuned Resonator for Spectroscopic Imaging", Journal of Magnetic Resonance, vol. 86, pp. 645–651, 1990.

J.R. Fitzsimmons, et al., "A Comparison of Double–Tuned Surface Coils", Magnetic Resonance In Medicine, vol. 10, pp. 302–309, 1989.

Nina C. Gonnella, et al., "Design and Construction of a Simple Double–Tuned, Single–Input Surface–Coil Probe", Journal of Magnetic Resonance, vol. 85, pp. 24–34, 1989.

P. Van Hecke, et al., "Double–Tuned Resonator Designs for NMR Spectroscopy", Journal of Magnetic Resonance, vol. 84, pp. 170–176, 1989.

D. Ballon, et al., "Doubly Tuned Solenoidal Resonators for Small Animal Imaging and Spectroscopy at 1.5 Tesla", Magnetic Resonance Imaging, vol. 7, pp. 155–162, 1989.

Jeffrey R. Fitzsimmons, et al., "A Transformer–Coupled Double–Resonant Probe for NMR Imaging and Spectroscopy", Magnetic Resonance in Medicine, vol. 5, pp. 471–477, 1987.

A.B. Macnee, "VHF Amplifiers, Mixers, and Oscillators", Microwave Receivers, Chapter 5, pp. 122–125, S.N. Van Voorhis, editor, Dover Publications, Inc., NY, 1966.

Leland H. Hemming, "Piping", Architectural Electromagnetic Shielding Handbook, Chapter 7.5, pp. 118–124, 1992.

Edward F. Vance, "Coupling to Shielded Cables", John Wiley and Sons, NY, pp. 112–131, 1978.

Stephen A. Maas, "The RF and Microwave Circuit Design Cookbook", Artech House, Boston, pp. 3–17, 1998.

N. Marcuvitz, editor, "Waveguide Handbook", Dover Publications, Inc., N.Y., pp. 66–89, 1951.

Robert L. Shrader, "Electrical Fundamentals for Technicians", Second Edition, McGraw–Hill, Inc., pp. 389–411, 1977.

U.S. patent application Ser. No. 09/738,233, Eydelman et al., filed Dec. 15, 2000.

U.S. patent application Ser. No. 09/738,235, Eydelman et al., filed Dec. 15, 2000.

* cited by examiner

MRI ANTENNA

BENEFIT OF PROVISIONAL APPLICATION

The present application claims the benefit of U.S. Ser. No. 60/172,199, filed on Dec. 17, 1999, assigned to the assignee of the present invention and incorporated by reference, herein

RELATED APPLICATIONS

The present application is related to U.S. Ser. No. 09/738,233. and U.S. Ser. No. 09/738,235 filed on the same day as the present application, assigned to the assignee of the present application and incorporated by reference, herein.

FIELD OF THE INVENTION

This invention relates to radio frequency receiving and transmitting antennas, and, more particularly, to receiving and transmitting radio frequency antennas for use in magnetic resonance imaging.

BACKGROUND OF THE INVENTION

Magnetic resonance imaging ("MRI") is a well known, highly useful technique for diagnosing abnormalities in biological tissue. MRI can detect abnormalities which are difficult or impossible to detect by other techniques, without the use of x-rays or invasive procedures.

MRI uses changes in the angular momentum or spin of the atomic nuclei of certain elements within body tissue in a static magnetic field after excitation by radio frequency energy, to derive images containing useful information concerning the condition of the tissue.

During an MRI procedure, the patient is inserted into an imaging volume containing a static magnetic field. The vector of the angular momentum or spin of nuclei containing an odd number of protons or neutrons tends to align with the direction of the magnetic field. A transmitting antenna within the imaging volume emits a pulse or pulses of radio frequency energy having a particular bandwidth of frequency, referred to as the resonant or Larmor frequency, shifting the vectors of the nuclei out of alignment with the applied magnetic field. The spins of the nuclei then turn or "precess" around the direction of the applied primary magnetic field. As their spins precess, the nuclei emit small radio frequency signals, referred to as magnetic resonance ("MR") signals, at the resonant or Larmor frequency, which are detected by a radio frequency receiving antenna tuned to that frequency. The receiving antenna is typically positioned within the imaging volume proximate the patient. Gradient magnetic fields are provided to spatially encode the MR signals emitted by the nuclei. After the cessation of the application of radio frequency waves, the precessing spins gradually drift out of phase with one another, back into alignment with the direction of the applied magnetic field. This causes the MR signals emitted by the nuclei to decay. The MR signals detected by the receiving antenna are amplified, digitized and processed by the MRI system. The same antenna may act as the transmitting and receiving antenna. Hydrogen, nitrogen-14, phosphorous-31, carbon-13 and sodium-23 are typical nuclei detected by MRI. Hydrogen is most commonly detected because it is the most abundant nuclei in the human body and emits the strongest MR signal.

The rate of decay of the MR signals varies for different types of tissue, including injured or diseased tissue, such as cancerous tissue. By known mathematical techniques involving correlation of the gradient, magnetic fields and the particular frequency of the radio frequency waves applied at various times with the rate of decay of the MR signals emitted by the patient, it is possible to determine the concentrations and the condition of the environment of the nuclei of interest at various locations within the patient's body. This information is typically displayed as an image with varying intensities, which are a function of the concentration and environment of the nuclei of interest. Typical MRI systems are the Quad 7000 and Quad 12000 available from FONAR Corporation, Melville, N.Y. for example.

The quality of the magnetic resonance image is directly related to the characteristics of the receiving and transmitting antenna. Significant electrical characteristics of the antenna include its sensitivity, Q factor and the signal-to-noise ratio.

Sensitivity is the signal voltage generated in the receiving antenna by MR signals of a particular magnitude. The higher the sensitivity within the region to be imaged, the weaker the signals which can be detected. The sensitivity of the antenna is preferably substantially uniform with respect to MR signals emanating from all volume elements within the region of the subject which is to be imaged.

The Q or quality factor, which is closely related to the sensitivity of the antenna, is a measure of the ability of the antenna to amplify the received signal. The Q-value of the antenna can be lowered by a patient proximate or within an antenna, due to capacitive and to a lessor extent the inductive coupling between the patient and the antenna. Antennas must therefore have a high Q-value when they are unloaded and the Q-value must not become too diminished by the presence of the patient. On the other hand, the coil must couple well with the region of a patient's anatomy which is to be imaged.

Signal-to-noise ("S/N") ratio is the ratio between those components in the electrical impulses appearing at the antenna terminals representing the detected MR signals and the components representing spurious electromagnetic signals in the environment and internally generated thermal noise from the patient. To optimize the S/N ratio, the antenna should have low sensitivity to signals from outside the region to be imaged and to thermal noise. To enhance both S/N ratio and sensitivity, the antenna is "tuned" or arranged to resonate electrically at the frequency of the MR signals to be received (the Larmor frequency), which is typically several megahertz or more. Neither the coil size nor geometry of the antenna can be allowed to create an inductance or self-capacitance which prevents tuning to the desired frequency.

The antenna must also meet certain physical requirements. The antenna should have a high filling factor, which maximizes the amount of tissue which fits within the volume detected by the windings of the coil. The antenna must also fit within the relatively small imaging volumes typically provided for receiving the subject within the magnet assembly, along with other components of the system and the subject. The antenna should not cause significant discomfort to the subject. Additionally, the antenna should be easy to position with respect to the subject, and be relatively insensitive to minor faults in positioning relative to the subject.

These numerous considerations often conflict with one another and therefore must be balanced during the design process.

The sensitivity and S/N ratio of MRI radio frequency antennas have been improved by positioning a first coil, tuned to resonate at the Larmor frequency of the element of interest, proximate the part of the subject which is to be imaged, and positioning a similarly tuned second coil, typically a single loop, adjacent to the first coil. The second coil is connected to the pre-amplifier of the MRI system. The first and second coils are inductively coupled to each other. MR signals emitted by the patient induce voltages in the first coil, causing current to flow within the coil. The current generates a magnetic field which induces voltage in the second coil. The MR signals may induce voltages in the first coil, as well. The voltages induced in the first coil are processed by the MRI system. Use of two such coils amplifies the MR signals and filters spurious signals outside of the frequency band of the Larmor frequency. See, for example, U.S. Pat. No. 5,583,438 and U.S. Pat. No. 5,575,287, assigned to the assignee of the present invention.

Radio frequency antenna coils may be used in a variety of configurations. For example, the coil may be receiving coil, as discussed above. The receiving coil may be part of an array of receiving coils, such as in the primary and secondary coil arrangements, also discussed above. The receiving coil may also act as the transmitting coil of the MRI system. A pair of receiving coils can also be arranged 90° with respect to each other to enable quadrature detection, which improves the signal-to-noise ratio.

SUMMARY OF THE INVENTION

In accordance with the present invention, an MRI antenna is disclosed comprising a first coaxial cable unit comprising a first inner conductor with first and second ends and a first outer conductor substantially surrounding the inner conductor, the first outer conductor having first and second ends. The first coaxial cable unit has a concave curvature facing a first direction. A second coaxial cable unit is provided also comprising an inner conductor with first and second ends and an outer conductor substantially surrounding the inner conductor. The outer conductor has first and second ends, as well. The second coaxial cable unit has a concave curvature facing a second direction opposite the first direction. The concave curvature of the first and second coaxial cables generally face each other to define a region between the first and second coaxial cable units for receiving a body part. The first end of the first inner conductor may be electrically connected to the first end of the second inner conductor through a first capacitor and the first end of the first outer conductor may be electrically connected to the first end of the second outer conductor through a second capacitor. Preferably, the first ends of the inner conductors and the first ends of the outer conductors are on opposite sides of the first and second coaxial cable units. The second end of the first inner conductor and the second end of the second inner conductor are not connected to each other and the second end of the first outer conductor and the second end of the second outer conductor are not connected to each other. They are, however, preferably inductively coupled to each other and a distributed capacitance exists between them. While the circuits including the inner and outer conductors are open circuits, it is believed, without limiting the scope of the invention, that the inductive coupling and distributed capacitance between the inner and outer conductors of the first and second coaxial cable units enables the circuits to be tuned to the same frequency. The first and second outer conductors provide an output of the antenna. The inner and outer conductors of the first and second coaxial cable units are tunable to the same frequency.

In accordance with another embodiment of the present invention, an MRI antenna is disclosed comprising a base for surrounding a body part. The base has an upper portion supporting at least one upper coaxial cable unit and a lower portion supporting at least one lower coaxial cable unit. The coaxial cable units comprise an inner and an outer conductor substantially surrounding the inner conductor. The at least one upper coaxial cable unit has portions adjacent to the at least one lower coaxial cable unit for inductively coupling the upper and lower coaxial cable units during operation. The inner conductor of the at least one upper coaxial cable unit is capacitively connected to the inner conductor of the at least one lower coaxial cable unit through a single capacitive connection and the outer conductor of the at least one upper coaxial cable unit is capacitively connected to the outer conductor of the at least one lower coaxial cable unit through a single capacitive connection. An output of the antenna is provided from the outer conductors of the at least one upper coaxial cable unit and from the at least one lower coaxial cable unit.

In accordance with another embodiment of the present invention, an MRI antenna is disclosed comprising first, second and third coaxial cable units. Each coaxial cable unit comprises inner and outer conductors, wherein each outer conductor substantially surrounds each inner conductor. The inner and outer conductors of each coaxial cable unit are inductively coupled during operation. The first, second and third coaxial cable units lie in first, second and third parallel planes, respectively. The first plane is between the second and third planes and the first and third coaxial cable units are aligned. The first, second and third coaxial cable units have a concave curvature, wherein the curvature of the first and third coaxial cable units is in a first direction and the curvature of the second coaxial cable unit is in a second direction opposite the first direction. The first, second and third coaxial cable units define a region for receiving a body part. The second coaxial cable unit has portions adjacent to the first and third coaxial cable units for inductively coupling the second coaxial cable unit to the first and third coaxial cable units. The inner and outer conductors of the first and third coaxial cable units are electrically connected to form respective circuits tuned to the same frequency. The inner conductors of the first and third coaxial cable units are capacitively coupled to the inner conductor of the second coaxial cable unit through a single capacitive connection and the outer conductors of the first and third coaxial cable units are capacitively coupled to the outer conductor of the second coaxial cable unit through a single capacitive connection. The antenna further comprises outputs from the coupled outer conductors of the first and third coaxial cable units and from the outer conductor of the second coaxial cable unit.

In accordance with another embodiment of the present invention, an MRI antenna is disclosed comprising first, second, third, fourth and fifth coaxial cable units. Each coaxial cable unit comprises inner and outer conductors. The outer conductor of each coaxial cable unit substantially surrounds the inner conductor of the unit and the inner and outer conductors of each are inductively coupled to each other during operation. The first, second, third, fourth and fifth coaxial cable units lie in first, second, third, fourth and fifth parallel planes, respectively. The first plane is between the third and fourth planes and the second plane is between the fourth and fifth planes. The first and second coaxial cable units are aligned and the third, fourth and fifth coaxial cable units being aligned. The first, second, third, fourth and fifth coaxial cable units each have a concave curvature. The curvature of the first and second coaxial cable units is in a first direction and the curvature of the third, fourth and fifth coaxial cable units is in a second direction opposite the first direction. The first, second, third, fourth and fifth coaxial cable units define a region for receiving a body part. The first coaxial cable unit has portions adjacent to the third and fourth coaxial cable units for inductively coupling the first coaxial cable unit to the third and fourth coaxial cable units, during operation. The second coaxial cable unit has portions adjacent to the fourth and fifth coaxial cable units for inductively coupling the second coaxial cable unit with the fourth and fifth coaxial cable units during operation. The inner and outer conductors of the first and second coaxial cable units are electrically connected to form respective circuits tuned to a frequency and the inner and outer conductors of the third, fourth and fifth coaxial cable units are electrically connected to form respective circuits tuned to the frequency. The inner conductors of the first and third coaxial cable units are capacitively coupled to the inner conductors of the third, fourth and fifth coaxial cable units through a single capacitive connection and the outer conductors of the first and second coaxial cable units are capacitively coupled to the outer conductors of the third, fourth and fifth coaxial cable units through a single capacitive connection. An output from the antenna is provided from the outer conductors of the first and third coaxial cable units and from the outer conductors of the third, fourth and fifth coaxial cable units. The circuits including the respective inner and outer conductors are tunable to the same frequency. The inner and outer conductors of the third, fourth and fifth coaxial cable units are preferably connected in parallel to lower the inductance of the antenna array, enabling tuning to the high Larmor frequencies in high magnetic field strengths (6,000 Gauss and above). In addition, the capacitive connection from the inner and outer conductors of the first and second coaxial cable units to the respective inner and outer conductors of the third, fourth and fifth coaxial cable units, minimizes the generation of eddy currents. This embodiment is particularly suited for magnetic resonance imaging of the lumbar spine.

Transmitting antennas and magnetic resonance imaging systems including the antennas of the present invention are also disclosed.

DETAILED DESCRIPTION OF THE INVENTION

Figure 1:
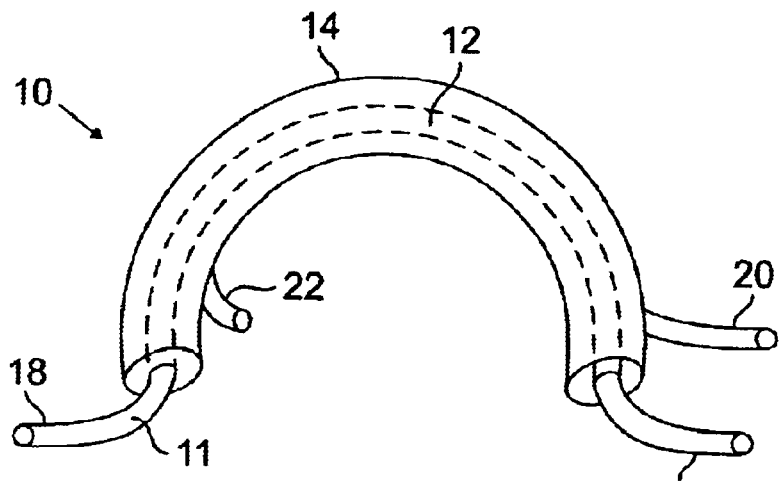
FIG. 1 is a plan view of a basic coaxial cable unit 10 of a magnetic resonance imaging ("MRI") antenna array in accordance with the present invention.
Figure 2:
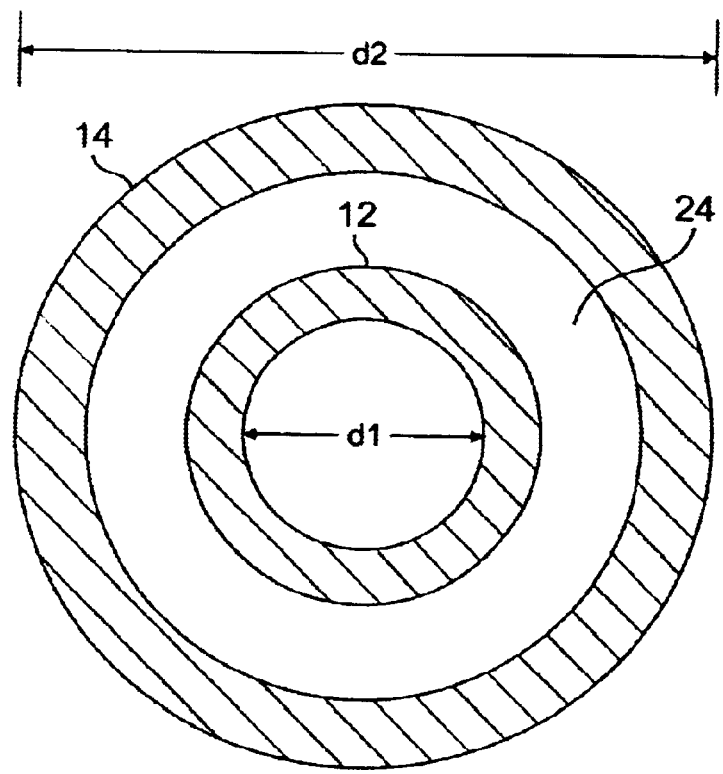
FIG. 2 is a cross-sectional view through line 2—2 of FIG. 1.

FIG. 1 is a plan view of a basic unit 10 of a magnetic resonance imaging ("MRI") antenna array in accordance with the present invention. The unit 10 is a coaxial cable comprising an inner conductor 12 and an outer conductor 14, as shown in the cross-sectional view of FIG. 2. The inner conductor 12 and the outer conductor 14 are separated by a dielectric material 24, such as Teflon®, for example. Each conductor 12, 14 may be copper tubing.

In one embodiment, the diameter $d_1$ of the inner conductor 12 may be about 0.125 inches. The diameter $d_2$ of the outer conductor 14 may be about 0.25 inches and the wall thickness of each conductor 12, 14 may be about 0.032 inches.

The coaxial cable unit 10 may be formed of readily available soft copper refrigeration tubing of appropriate diameters. Such tubing is available from Metal Product, Wynn, Ark., for example. The tubing corresponding to the inner conductor 12 is covered with Teflon® tubing, such as TFT70C polytetrafluoroethylene, available from AIN Plastics, Inc., Mount Vernon, N.Y., for example. The Teflon® covered inner conductor 12 is then inserted into the tubing corresponding to the outer conductor 14 to form the coaxial cable unit 10. A flexible coaxial cable unit is described further, below.

Returning to FIG. 1, the inner conductor 12 has two ends 16, 18 and the outer conductor 14 has two ends 20, 22. The shape of the coaxial cable unit 10 is generally concave.

Figure 3:
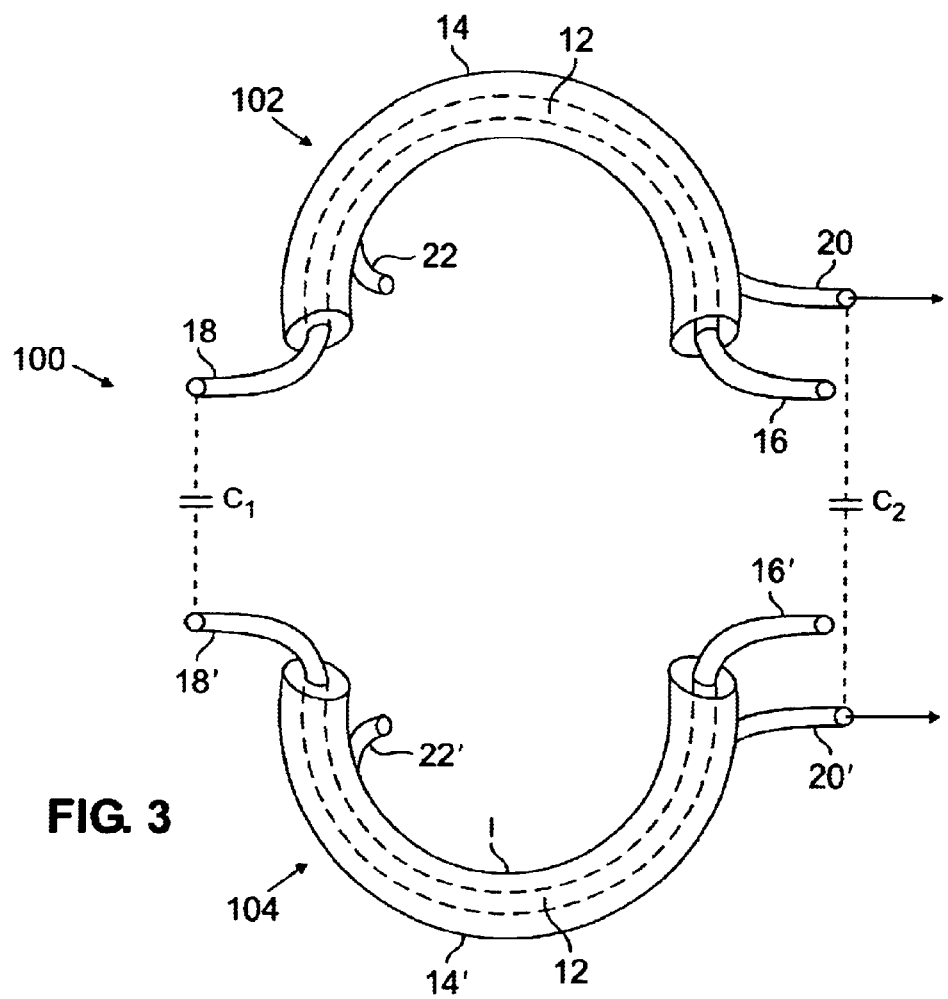
FIG. 3 shows preferred electrical connections in an antenna array comprising two basic coaxial cable units, as in FIG. 1. in accordance with the present invention.

FIG. 3 shows an antenna array 100 in accordance with the present invention, comprising two coaxial cable units 102, 104. The components of the first, upper. coaxial cable unit 102 are identified by the same numbers as the coaxial cable unit 10 in FIG. 1. The second, lower coaxial cable unit 104 comprises an inner conductor 12' having two ends 16', 18' and an outer conductor 14' having two ends 20', 22'.

Figure 4:
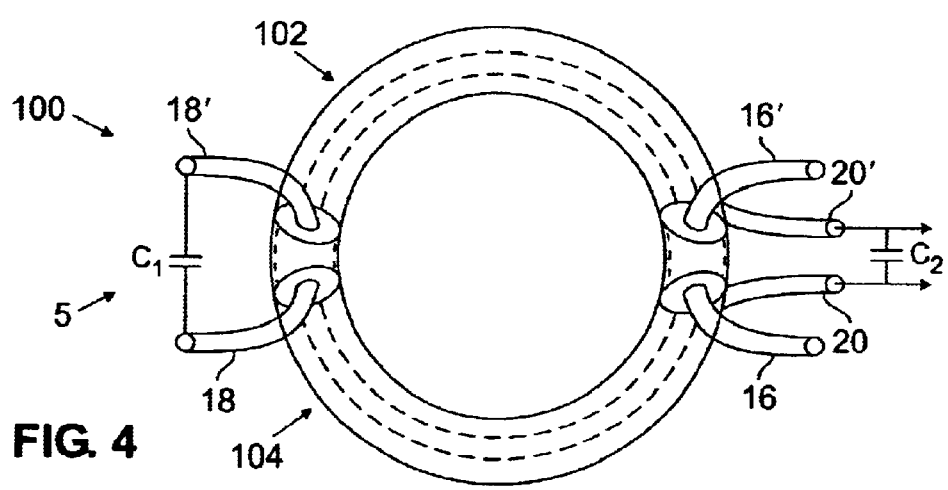
FIG. 4 is a front view of a preferred configuration of an antenna array, including two basic coaxial cable units.
Figure 5:
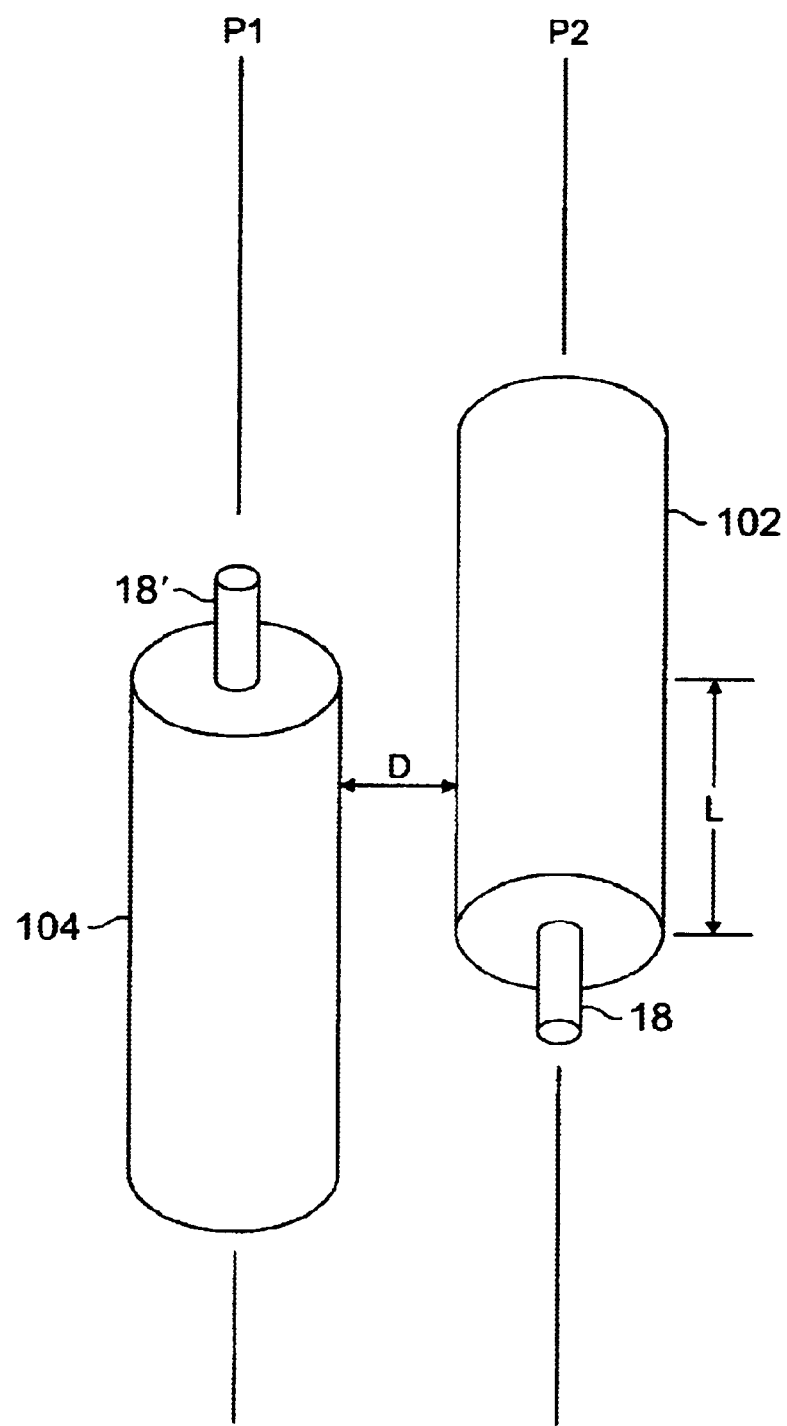
FIG. 5 is a side view of the antenna array of FIG. 4, along arrows 5.

The concave curvatures of the first and second coaxial cable units 102, 104 face in opposite directions, towards each other, as shown in the front view of the antenna array 100 of FIG. 4. FIG. 5 is a side view of FIG. 4, along arrow 5. Preferably, the two coaxial cable units are in parallel planes P1, P2 slightly displaced from each other, as shown in FIG. 5. The distance "D" between adjacent coaxial cable units may be about 1 inch. Portions of the ends of the first and second coaxial cable units 102, 104 are also preferably adjacent to each other. FIG. 5 also shows a length "L" of adjacent sections of the coaxial cable units 102, 104, of about 1.5 inches. It is noted that if the coaxial cable units are in different planes parallel to each other, their curvatures are only "generally" directed towards each other. The phrase "face towards each other" is meant to encompass the configuration of FIG. 5 and the other antenna arrays disclosed herein. The overlap of the coaxial cable units enables the adjacent portions of the first and second coaxial cable units 102, 104 to be inductively coupled and capacitively coupled through a distributed capacitance. Preferably, the coupling is tight coupling. More preferably, the coupling is critical coupling.

The first coaxial cable segment 102 is capacitively coupled to the second coaxial cable segment 104 by connecting one pair of adjacent ends 18, 18' of the inner conductors 12, 12', respectively, through a capacitor $C_1$, and connecting one pair of adjacent ends of the outer conductors 20, 20' through a capacitor $C_2$. The conductors 12, 12' and the outer conductors 20, 20' are tuned to the Larmor frequency of the species of interest. The capacitor $C_2$ may be the varactor in the receiver section of an MRI system, or may be connected to the varactor in the receiver section of the MRI system. Preferably, the connected ends of the array 100 are at opposite ends. The ends 16, 16' and the ends 22, 22' are not electrically connected.

A distributed capacitance exists between the inner and outer conductors of each coaxial cable segment 102, 104, which are inductively coupled to each other. Preferably, the inner and outer conductors 12, 14 are tightly coupled to each other. More preferably, they are critically coupled to each other.

Figure 6A:
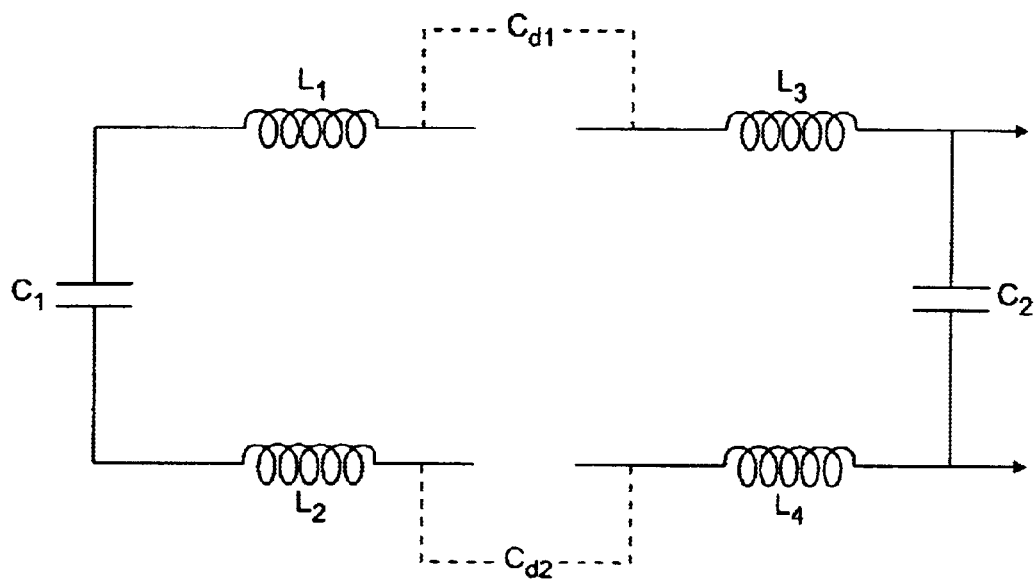
FIG. 6a is an electrical schematic diagram of a circuit corresponding to the configuration of FIG. 4.

FIG. 6a is an electrical schematic diagram of a circuit corresponding to the configuration of FIGS. 3 and 4. The inductor $L_1$ corresponds to the inner conductor 12 of the first coaxial cable unit 102; the inductor $L_2$ corresponds to the inner conductor 12' of the second coaxial cable unit 102; the inductor $L_3$ corresponds to the outer conductor 14 of the first coaxial cable unit 102; and the inductor L4 corresponds to the outer conductor 14' of the second coaxial cable unit 104. The capacitors $C_1$ and $C_2$ are commonly identified in FIGS. 3–6. A distributed capacitance Cd1 between the inner and outer conductors 12, 14 of the coaxial cable unit 102, and the distributed capacitance Cd2 between the inner and outer conductors 12', 14' of the coaxial cable unit 104, are also shown.

Figure 6B:
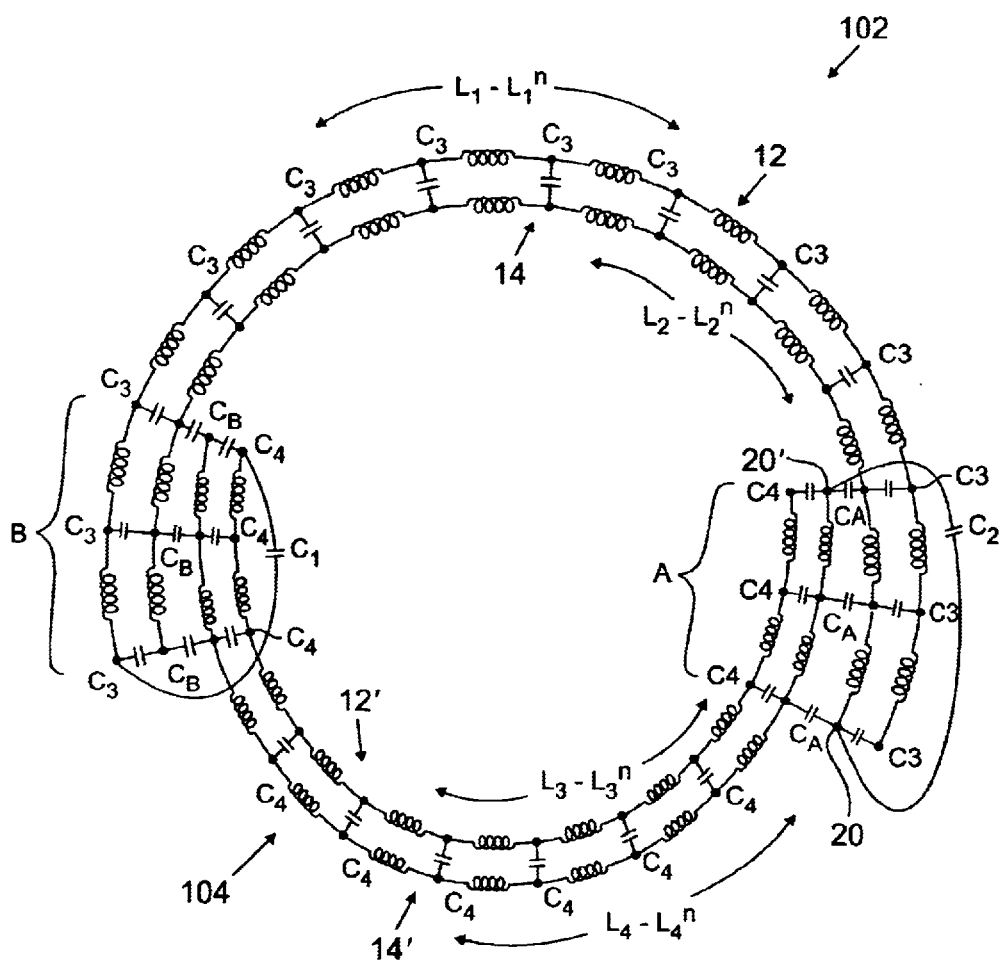
FIG. 6b is an equivalent schematic diagram of the antenna array of FIG. 4, showing in more detail the distributed capacitances in the antenna array.

FIG. 6b is an equivalent schematic diagram of the antenna array 100 of FIG. 4, showing in more detail the distributed capacitances. The inner conductor 12 of the first coaxial cable unit 102 is represented by a plurality of inductors $L_1$–$L_1{}^n$. The outer conductor 14 of the first coaxial cable unit 102 is represented by a plurality of inductors $L_2$–$L_2{}^n$. The distributed capacitance between the inductively coupled inner and outer conductors 12, 14 is represented by a plurality of capacitors $C_3$.

The inner conductor 12' of the second coaxial cable unit 104 is represented by a plurality of inductors $L_3$–$L_3{}^n$. The outer conductor 14' of the second coaxial cable unit 104 is represented by a plurality of inductors $L_4$–$L_4{}^n$. The distributed capacitance between the inductively coupled inner and outer conductors 12', 14' is represented by a plurality of capacitors $C_4$.

The second end 18 of the inner conductor 12 is shown connected to the second end 18' of the inner conductor 12' through the capacitor $C_1$. The first end 20 of the outer conductor 14 is shown electrically connected through the capacitor $C_2$ to the first end 20' of the outer conductor 14'.

The overlapping portions of the first and second coaxial cable units 102, 104 are shown in the regions A and B. Capacitors $C_A$, $C_B$, representing the distributed capacitance between the overlapping portions of the coaxial cable units 102, 104, respectively, are also shown.

Additional coaxial cable units 10 may be added to the array. For example, FIG. 7 shows an antenna array 200 comprising three coaxial cable units 202, 204, 206, which lie in three parallel planes P1, P2, P3, as shown in FIG. 8.

Preferably, the third coaxial cable unit 206 is aligned with one of the coaxial cable units, here the coaxial cable unit 204. Also, the third coaxial cable unit 206 lies on the opposite side of the coaxial cable unit 202 as the coaxial cable unit 204. As in FIGS. 4 and 5, portions of the coaxial cable unit 206 are adjacent to portions of the coaxial cable unit 202 to enable inductive coupling and capacitive coupling through distributed capacitance between them.

Figure 7:
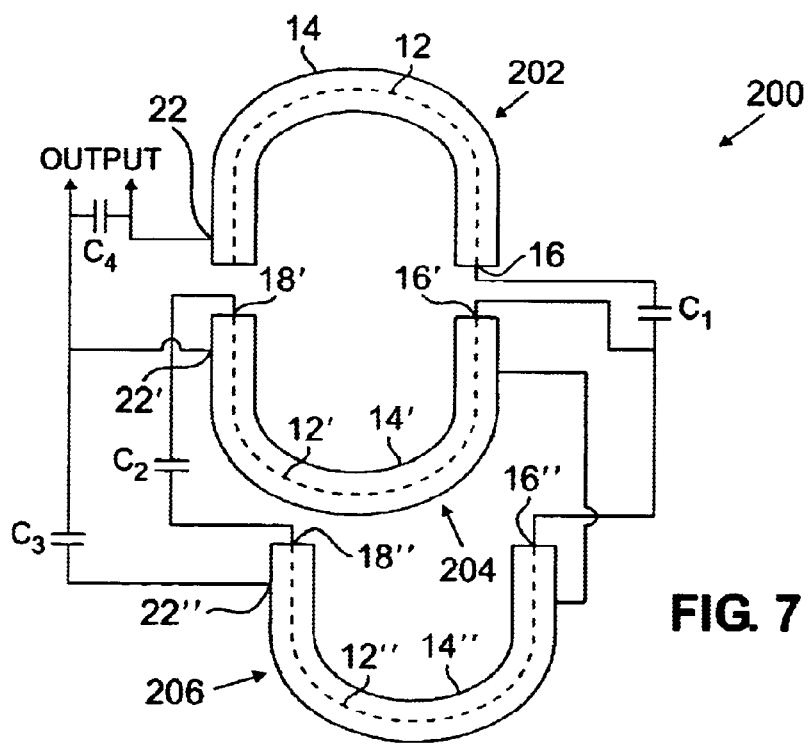
FIG. 7 shows preferred electrical connections in an antenna array comprising three basic coaxial cable units, in accordance with the present invention.
Figure 8:
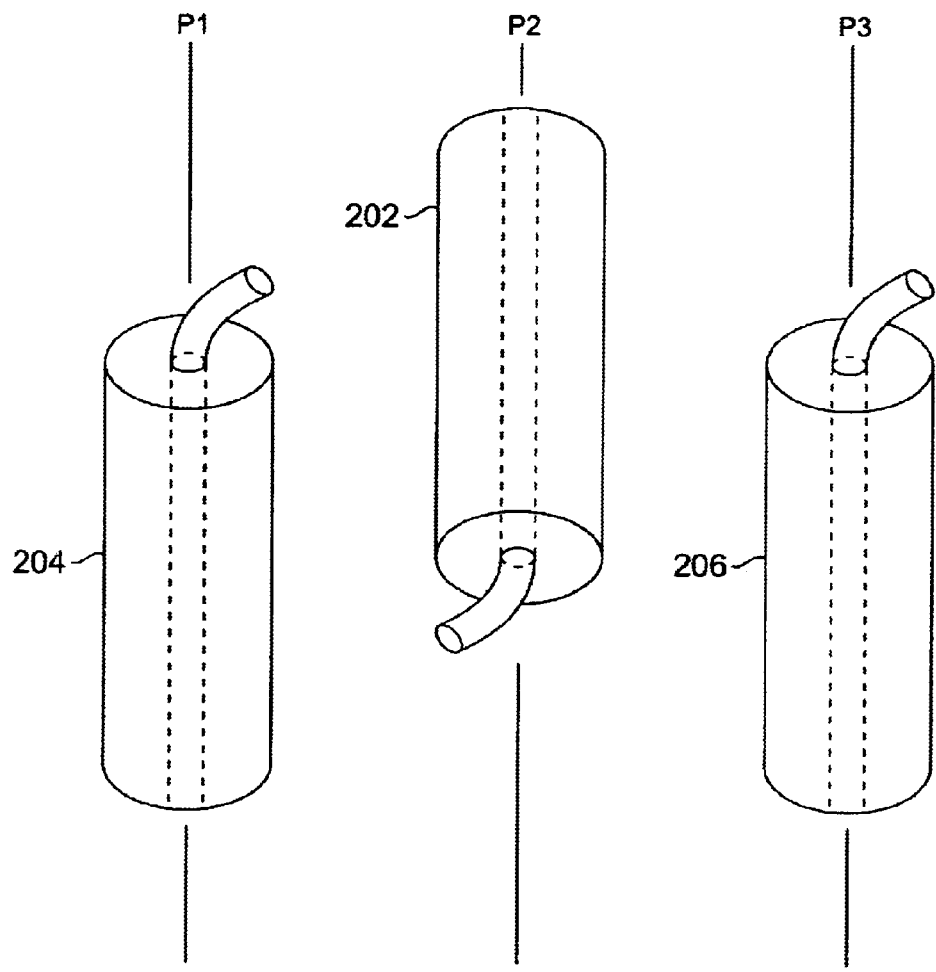
FIG. 8 is schematic representation of a side view of the antenna array of FIG. 7.

FIG. 7 shows the electrical connections between the three coaxial cable units 202, 204, 206 in a preferred configuration. Ends 16', 16" of the inner conductors 12', 12" of the second and third coaxial cable units 204, 206 are directly electrically connected in parallel. One end 18 of the inner conductor 12 of the first coaxial cable unit 202 is connected through a capacitor $C_1$ to the parallel connected ends 16', 16" of the conductors 12', 12" of the second and third coaxial cable units 204, 206.

One end 22 of the outer conductor 14 of the first coaxial cable unit 202 provides an output of the antenna array 200. One end 18' of the inner conductor 12' of the second coaxial cable unit 204 is connected to one end 18" of the inner conductor 12" of the third coaxial cable unit 206 through a capacitor $C_2$. One end 22' of the outer conductor 14' of the second coaxial cable unit 204 is connected to one end 22" of the outer conductor 14" of the second coaxial cable unit 206 through a capacitor $C_3$. The inner conductors 12, 12', 12" and the outer conductors 14, 14', 14" of the first, second and third coaxial cable units 202, 204, 206 are tuned to the Larmor frequency of the species of interest.

The second output of the antenna array 200 is provided from the outer conductors 18', 18" of the second and third coaxial cable units 202, 204, respectively. The two outputs of the antenna are connected across a capacitor $C_4$. The outputs may be connected to the varactor in the receiver subsystem of the MRI system or the capacitor $C_4$ may be the varactor in the receiver subsystem.

A fourth coaxial cable unit (not shown) may be added to the antenna array 200, aligned with the first coaxial cable unit 202, in a plane parallel to the planes P1, P2, P3, on the side of the coaxial unit 204 or the side of the coaxial cable unit 206 opposite the coaxial cable unit 202. One end of the inner conductor of the fourth coaxial cable unit could be directly electrically connected to one end of the inner conductor 12 of the first coaxial cable unit 202. One end of the outer conductor of the outer coaxial cable unit could be directly electrically connected to the outer conductor of the first coaxial cable unit 202. The other ends of the inner and outer conductors of the fourth coaxial cable unit could be connected to the corresponding ends of the inner and outer conductors of the first coaxial cable units through capacitors.

Figure 9:
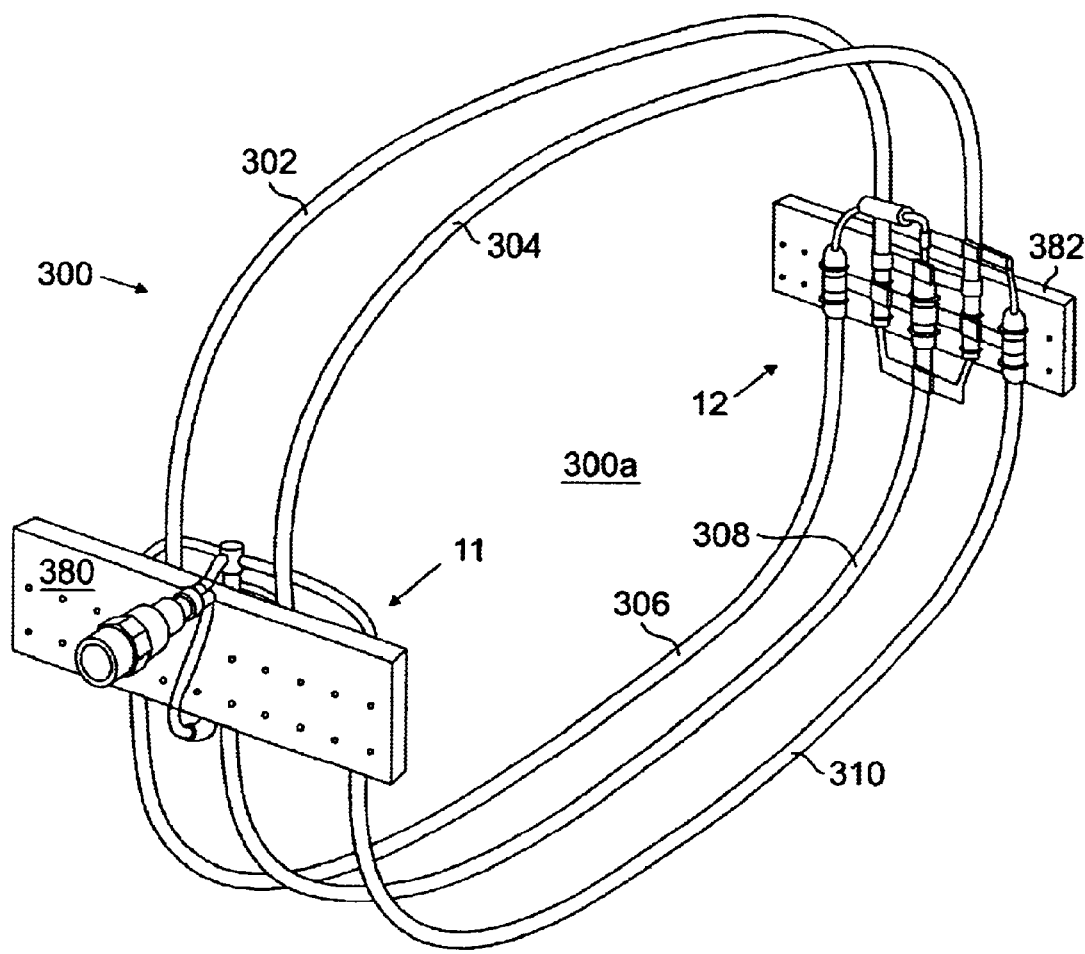
FIG. 9 is a perspective view of an experimental model of an antenna array of five coaxial cable units in accordance with the present invention, particularly suited for use in imaging the lumbar spine of a patient.

FIG. 9 is a perspective view of an experimental model of an antenna array 300 particularly suited for use in imaging the lumbar spine of a patient. The antenna array 300 includes 5 coaxial cable units, two adjacent upper coaxial cable units 302 and 304, and three adjacent lower coaxial cable units 306, 308, 310. Each coaxial cable unit has a generally U-shaped configuration. Together, the upper and lower coaxial cables units 302–310 define a region 300a for being positioned around the lumbar spine portion of a patient. Preferably, each coaxial cable unit 302–310 lies in a respective vertical parallel plane.

Figure 10:
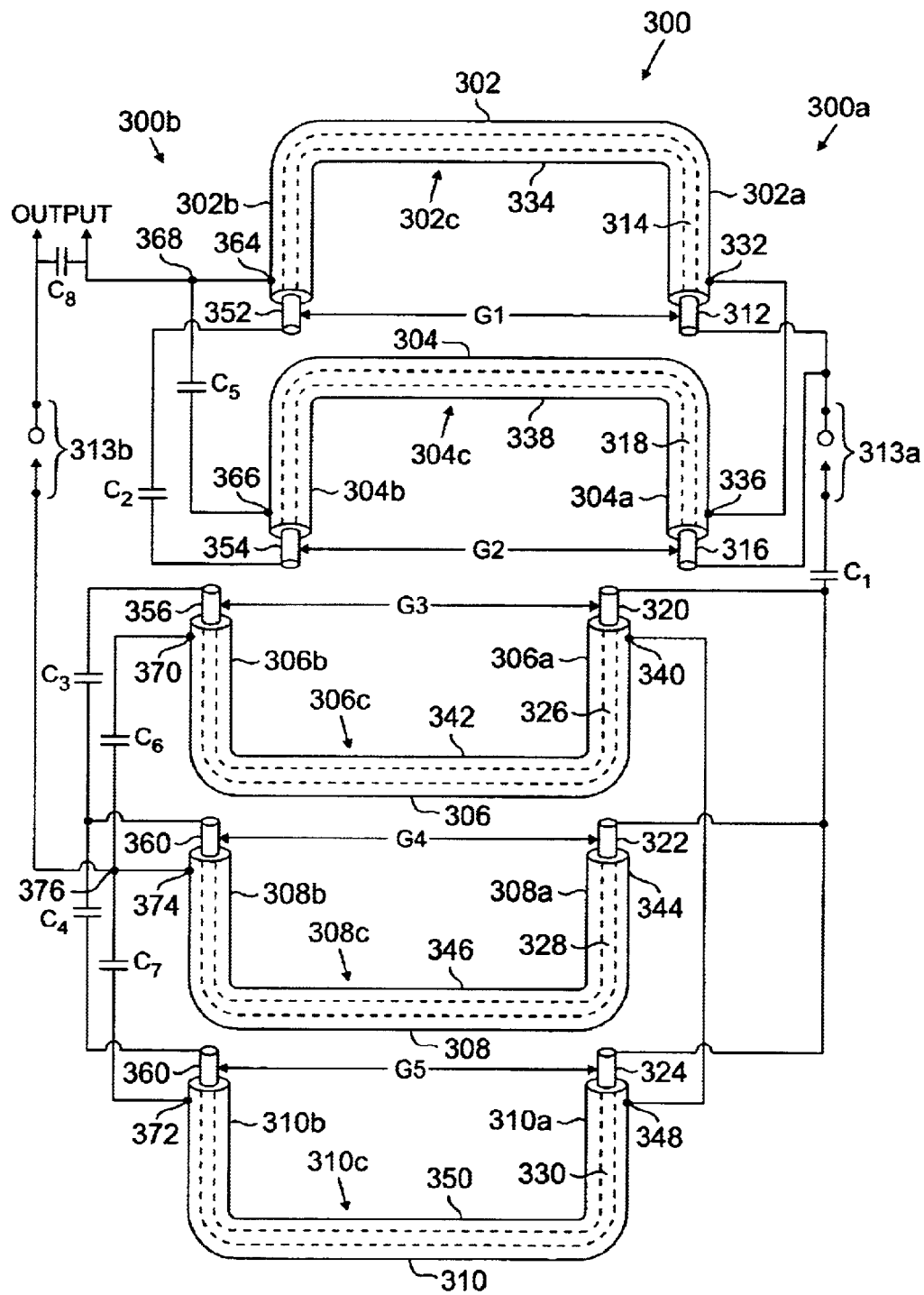
FIG. 10 is a schematic representation of the antenna array of FIG. 9, showing the preferred electrical connections between the five coaxial cable units.

FIG. 10 is a schematic representation of the antenna array 300 of FIG. 1, showing the preferred electrical connections between the coaxial cable units 302, 304, 306, 308, 310. The gaps G1, G2, G3, G4, G5 between the ends of each of the respective coaxial cable units are wide, to accommodate the torso of an adult patient. In one example, the lengths of the gaps G1, G2, G3, G4, G5 was about 18 inches, the gap height "H" in FIG. 9 was about 11 inches, the distance "$D_2$" between the cables 302 and 304 was about 2 inches and the distance between the cables 306, 308 and 10 was about 1.5 inches.

Figure 11:
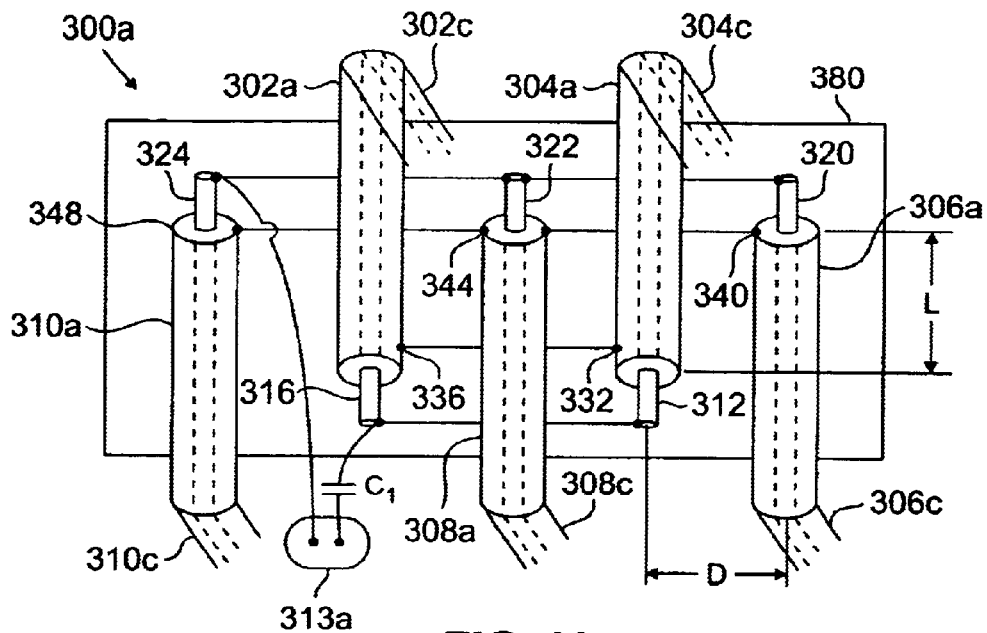
FIG. 11 is a schematic representation of the plate 380 of FIG. 9, showing the connections on the right side of the schematic diagram of FIG. 10.
Figure 12:
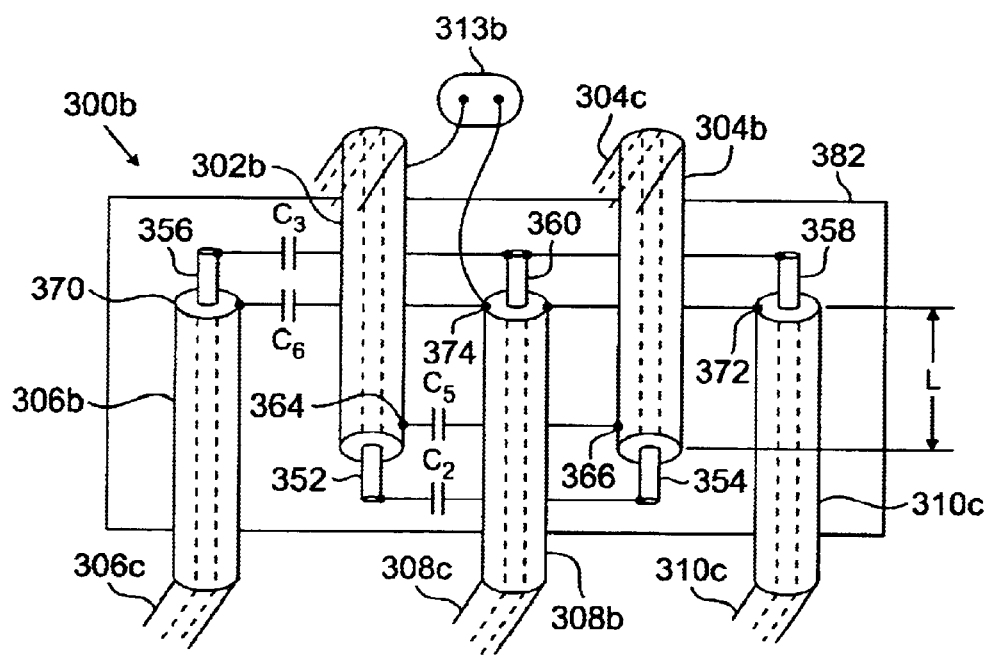
FIG. 12 is a schematic representation of the plate 382 of FIG. 9, showing the connections on the left side of the schematic diagram of FIG. 10.

Preferably, each of the coaxial cable units 302, 304, 306, 308, 310 has arm portions 302a, 302b, 304a, 304b, 306a, 306b, 308a, 308b, 310a, 310b, respectively, positioned adjacent to the sides of the patient. Long transverse portions 302c, 304c, 306c, 308c, 310c connect the respective arm portions. The transverse portions are positioned above and below the patient. The arm portions of the upper coaxial cable units 302, 304 and lower coaxial cable units are preferably positioned adjacent to each other, as shown in FIGS. 9, 11 and 12, and discussed further below.

Returning to FIG. 2, the right side 300a of the antenna array 300 will be described. In the upper coaxial cable units 302, 304, the right end 312 of the inner conductor 314 of the first upper coaxial cable unit 302 is directly electrically connected to the right end 316 of the inner conductor 318 of the second upper coaxial cable unit 304. The right end 332 of the outer conductor 334 of the first upper coaxial cable unit 302 is directly electrically connected to the right end 336 of the outer conductor 338 of the second upper coaxial cable unit 304.

In the lower coaxial cable units 306, 308, 310, the right ends 320, 322, 324 of the inner conductors 326, 328, 330, respectively, are directly electrically connected in parallel. The right ends 340, 344, 348 of the outer conductors 342, 346, 350, respectively, are also directly electrically connected in parallel.

The right ends 312, 316 of the upper inner conductors 314, 318 and the lower, parallel connected right ends 320, 322, 324 of the lower inner conductors 326, 328, 330 are connected to each other through a capacitor $C_1$, which may be part of a replaceable module of a BNC connector. The capacitor $C_1$ facilitates tuning between the upper and lower inner conductor. The inner conductors 312, 316 and the inner conductors 314, 318 of the upper coaxial cable units 302, 304 may be connected to the inner conductors 316, 320, 322, 324 the lower coaxial cable units 306, 308, 310 through a pin connector 313a. It is noted that the pin connector 313a is not shown in the experimental model of FIG. 9.

Turning to the left side 300b of the antenna array 300, in the upper coaxial cable units 302, 304, the left end 352 of the inner conductor 314 of the first upper coaxial cable unit 302 is electrically connected in series through a capacitor $C_2$ to the left end 354 of the inner conductor 318 of the second upper coaxial cable 304. The left end 364 of the outer conductor 334 of the first upper coaxial cable unit 302 is electrically connected through a capacitor $C_5$ to the left end 336 of the outer conductor 338 of the second upper coaxial cable unit 304. The node 368 between the left ends 364, 366 of the outer conductors 334, 338 provides one output to the antenna array 300.

The left end 356 of the inner conductor 326 of the first lower coaxial cable unit 306 is electrically connected in series through two capacitors $C_3$, $C_4$ to the left end 358 of the inner conductor 330 of the third coaxial cable unit 310. The left end 360 of the inner conductor 328 of the second lower coaxial cable unit 308 is electrically connected between the two capacitors $C_2$, $C_3$ at the node 362.

The left end 370 of the outer conductor 342 of the third coaxial cable unit 306 is electrically connected in series to the left end 372 of the outer conductor 350 of the third lower coaxial unit 310 through two capacitors $C_6$, $C_7$. The left end 374 of the outer conductor 346 is electrically connected to the node 376 between the capacitors $C_6$, $C_7$. The node 376 provides another output of the antenna array 300. The output from the lower coaxial cable units 306, 308, 310 extends to the output from the upper coaxial cable units 302, 304 through a pin connector 313b. The outputs are connected across a capacitor $C_8$. The capacitor $C_8$ may be connected to a varactor of the receiver system of an MRI system. The capacitor $C_8$ may also be the varactor of the receiver system. It is noted that the pin connector 313b is not shown in the experimental model of FIG. 9.

The inner conductors 314, 318 and the outer conductors 334, 338 are tuned to the same Larmor frequency. The inner conductors 326, 328, 330 and the outer conductors 342, 346, 350 are also tuned to the same Larmor frequency.

Because of the length of the coaxial cable units required in imaging the lumber spine, it is preferred to connect the lower coaxial cable units in parallel to lower the inductance of the antenna array 300. This allows the antenna array 300 to be tuned to the required frequency for most MRI systems including the higher frequencies used with MRI systems using higher strength magnetic fields (6,000 Gauss and above), such as the Quad 7000 and the Quad 1200 available from FONAR corporation, Melville, N.Y. The capacitive connection between the upper and lower coaxial cable units minimizes the generation of eddy currents. In addition, the preferred configuration of FIG. 10 allows for the connection of multiple upper and lower coaxial cable units through only two pin connectors 313a, 313b, simplifying the use of the antenna array 300 with a patient.

FIG. 11 is a schematic representation of the plate 380 of FIG. 9, showing the connections on the right side of the schematic diagram as shown in FIG. 10. FIG. 12 is a schematic representation of the plate 382 of FIG. 9, showing the connections on the left side of the schematic diagram of FIG. 10. Corresponding parts of FIGS. 10, 11 and 12 are similarly numbered. The length "A" of the overlapping portions of the adjacent coaxial cable units is about 1.5 inches.

Figure 13:
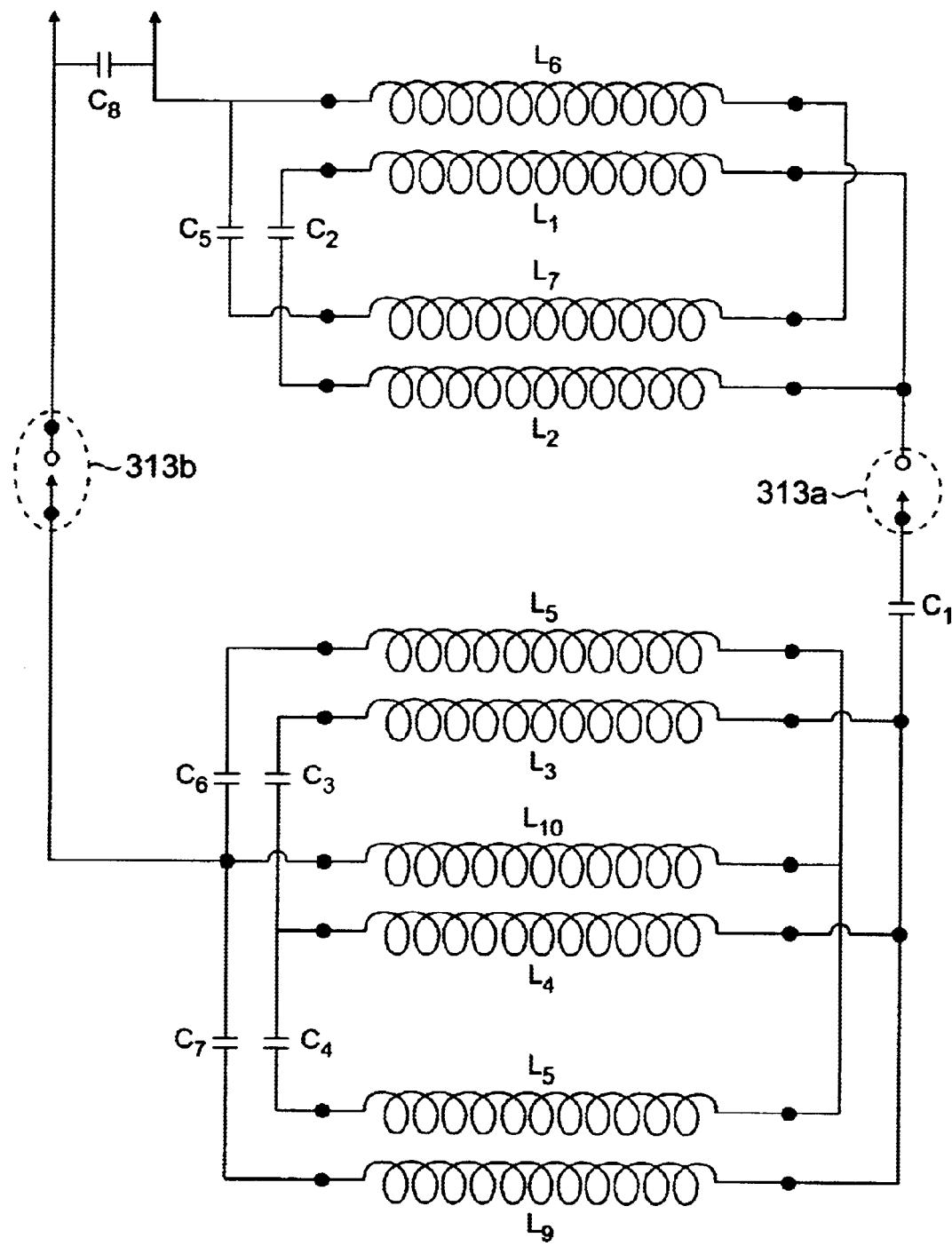
FIG. 13 is a schematic circuit diagram of the antenna array of FIG. 10.

FIG. 13 is a schematic circuit diagram of the antenna array 300 of FIG. 10. The capacitors $C_1$–$C_8$ of FIG. 10 correspond to the capacitors $C_1$–$C_8$ in FIG. 13. The inner and outer conductors in FIG. 10 are represented by the following inductors $L_1$–$L_{10}$ in FIG. 12:

| | |
|---|---|
| $L_1$ | Inner Conductor 314 |
| $L_2$ | Inner Conductor 318 |
| $L_3$ | Inner Conductor 326 |
| $L_4$ | Inner Conductor 329 |
| $L_5$ | Inner Conductor 330 |
| $L_6$ | Inner Conductor 334 |

-continued

| | |
|---|---|
| $L_7$ | Inner Conductor 338 |
| $L_8$ | Inner Conductor 342 |
| $L_9$ | Inner Conductor 344 |
| $L_{10}$ | Inner Conductor 346 |

Figure 14:
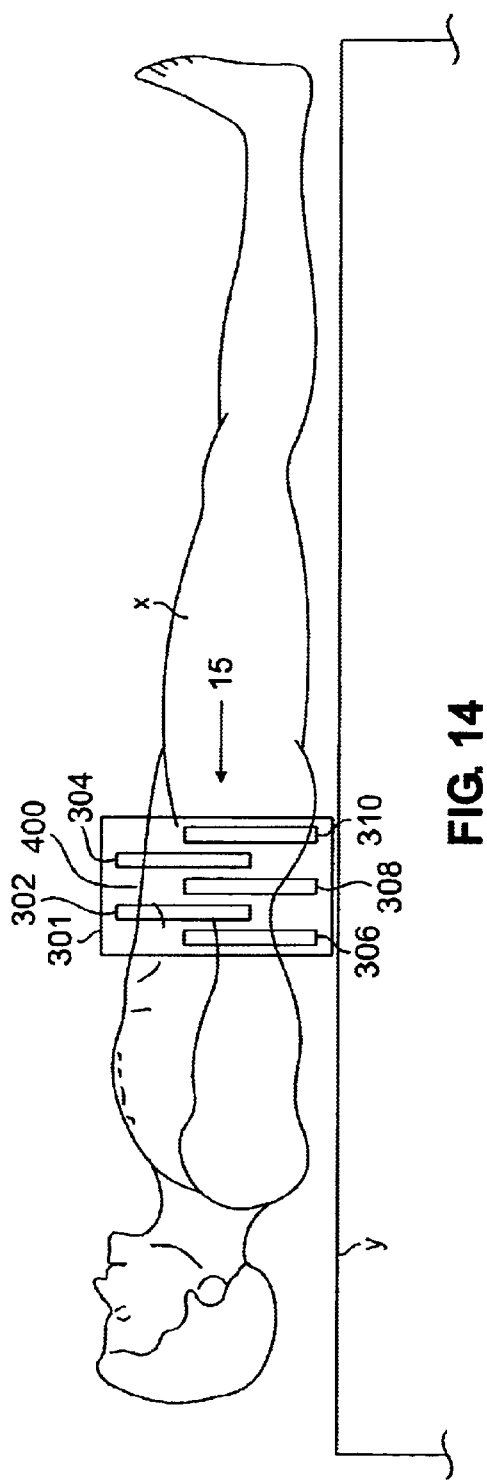
FIG. 14 is a side view of a patient with the antenna array of FIG. 9, positioned to image the lumbar spine.
Figure 15:
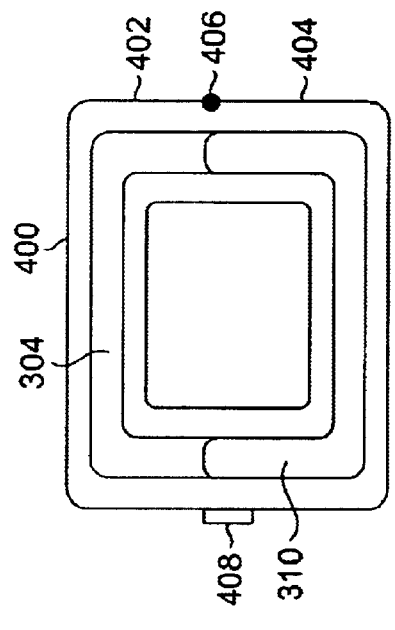
FIG. 15 is a front view of the antenna array along arrow 15 in FIG. 14.

FIG. 14 is a side view of a patient X with the antenna array 300 positioned to image the lumbar spine. The coaxial cable units 302–310 are supported by a base 400 of rigid, dielectric material, such as the fire resistant polymers polyvinyl, polytetrafluoroethylene and fluorinated ethylene propylene. Polymers having low dielectric constants are particularly preferred. The base 400 is positioned around the patient, proximate the lumbar spine region of the patient X. As mentioned above, each coaxial cable unit is supported in a vertical parallel, plane. FIG. 15 is a front view of the antenna array 300 along arrow 15 in FIG. 14. The base 400 may include an upper section 402 and a lower section 404 which may be connected on one side about a hinge or pivot 406. The other side may include a clasp or lock 408. The U-shaped coaxial cable unit 310 in the lower section 404 and the U-shaped coaxial cable unit 304 in the upper section 402 of the base 400 are shown.

The base 400 may be a flexible belt, as well. If a flexible belt is used, the coaxial cable units need also be flexible. High Power, High Temperature Air Dielectric Coaxial Cable, Andrew HST1-50 HELIAX, one-quarter inch diameter, available from Andrew Corporation, Orland Park, Ill., is a flexible coaxial cable which may be used, for example. The flexible coaxial cable may be supported by a cross-linked polyethylene foam available from Contour Fabricators, Inc., Grand Blanc, Mich.

Since the lower spine is proximate the lower coaxial cable units 306, 308, 310 during use, only two, centrally located upper coaxial cable units 302, 304 are therefore preferably provided. It has also been found that three lower coaxial cable units 306, 308, 310 are sufficient to cover the volume required to image the lower spine. Minimizing the number of coaxial cable units proximate the patient reduces the capacitive coupling of the antenna array 300 to the body of the patient. However, more or fewer upper and lower sections of coaxial cable units may be provided, to image the lumbar spine or other body parts.

The embodiment of FIGS. 9–15 has been described with respect to imaging the lumbar spine, which requires long conductors. Multiple capacitors and the parallel connections of the third, fourth and fifth coaxial cable units, are therefore preferably provided to lower the inductance of the antenna. However, it is understood to those skilled in the art that such an antenna array could be used with other body parts. If those body parts are smaller than the lumbar spine, enabling the use of shorter conductors, fewer capacitors and/or series connections could be used. In addition, if used in a low field strength magnet, where tuning to lower frequencies would be necessary, fewer capacitors and/or series connections could also be used.

The antenna arrays of the present invention may be part of a quadrature antenna system, by providing an additional receiving coil perpendicular to the antenna array. The receiving coil may be an antenna array as in FIG. 4, for example. Examples of quadrature systems are described in U.S. Ser. No. 09/738,235 filed on the same day as the present application, assigned to the assignee of the present invention and incorporated by reference, herein.

The coaxial cable antenna arrays discussed above can act as both a receiving and transmitting antenna.

Figure 16:
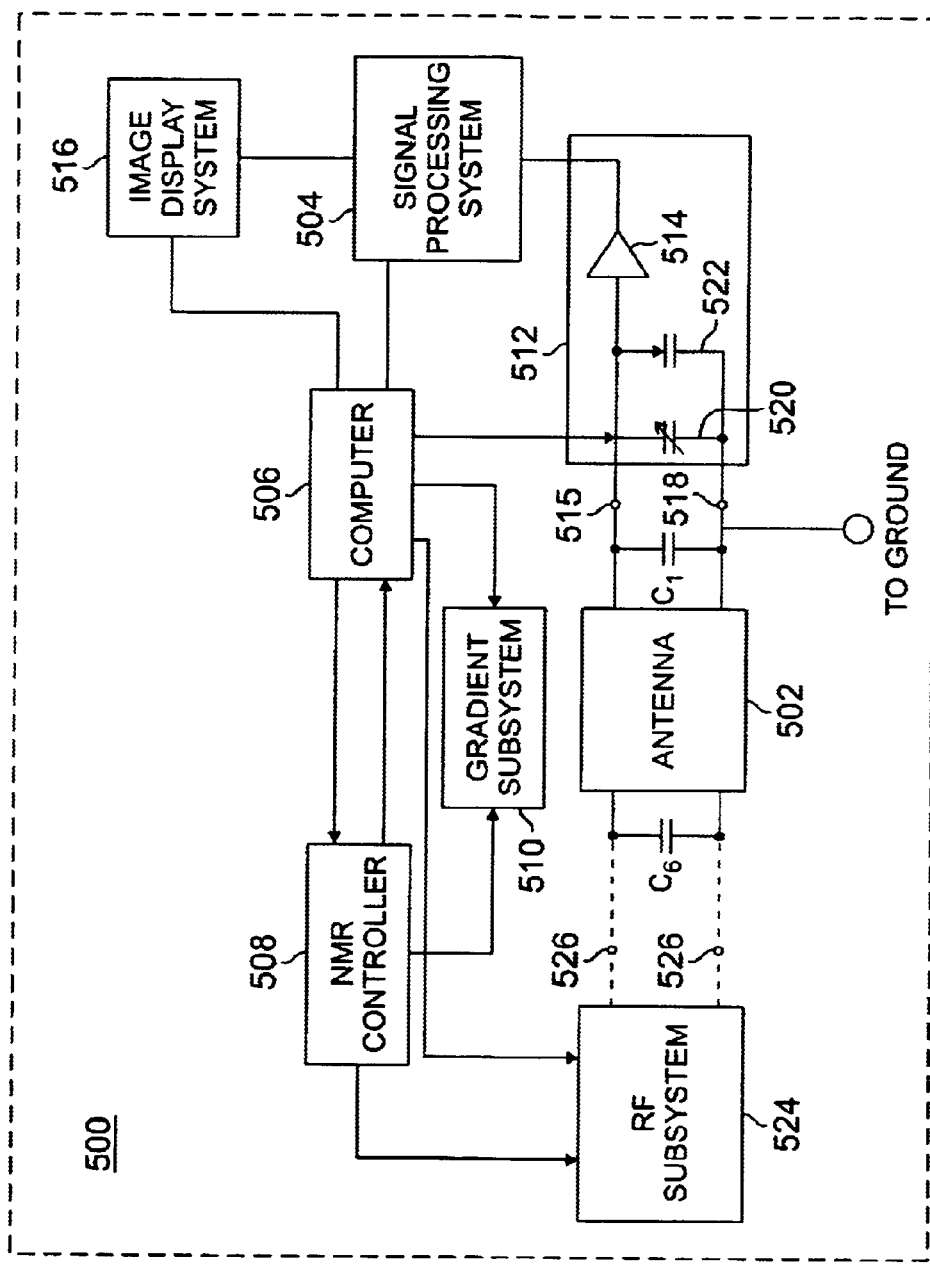
FIG. 16 is a schematic representation of portions of an MRI system, showing in particular a connection between or antenna array in accordance with the present invention with certain components of the MRI system.

FIG. 16 is a schematic representation of portions of an MRI system 500, showing in particular a connection between or antenna array 502 in accordance with the present invention with certain components of the MRI system 500. A signal processing system 504, a computer 506, an NMR controller 508, a gradient coil subsystem 510, a receiver subsystem 512 including a preamplifier 514, and an image display system 516 are also shown. The computer 506 controls the overall operation of the MRI system 500. The NMR controller 508 stores the timing of the scanning sequences and controls implementation of the scanning sequence. The signal processing system 504 typically includes a variable amplifier, a frequency down converter, an analog-to-digital converting array and a digital data processor (not shown), as is known in the art. The gradient coil subsystem 510 includes the gradient coils and a gradient waveform generator, which outputs particular waveforms for a desired scanning sequence to the gradient coils under the control of the NMR controller 508, also as is known in the art. The outputs from the outer conductors of the coaxial cable units providing the output of the antenna array 502 may be connected across a capacitor $C_1$ and to the receiver system 512 of the MRI system 500 through the port 518.

As discussed above, the presence of a patient provides a load on the antenna array 502 which lowers the antenna's Q. The presence of the patient also shifts the resonant frequency of the antenna array 502, which may require retuning to the desired Larmor frequency. A varactor, or variable capacitor 520 is therefore preferably provided between the capacitor $C_1$ of the antenna 502 and the preamplifier 516 parallel to the capacitor $C_1$, to enable retuning of the antenna array 502 when the antenna array is positioned with respect to the patient, as is known in the art. Alternatively, the capacitor $C_1$ may be the varactor 520. A back diode 522 is preferably provided parallel to the varactor 520 to prevent the passage of excessive voltage to the preamplifier 514, also as is known in the art. Voltage greater than about 0.7 volts is typically blocked by the back diode 522. The varactor 520 is controlled by the computer 506. The port 518 may be connected to the varactor 520, back diode 552 and preamplifier 510 through a short, low capacitance cable, or other appropriate means.

FIG. 16 also shows an optional connection between a capacitor $C_6$ and the antenna 502, and the RF transmitting subsystem 524 of the MRI system, through the optional port 526. The RF subsystem 524 includes a radio frequency power source (not shown). The RF subsystem 524 can also be connected to the capacitor $C_1$ through a switch controlled by the computer 506. The computer 506 would switch the connection between the RF subsystem 524 and the antenna 502, and the preamplifier 520 and the antenna 502, at appropriate times. The RF subsystem 524 is also controlled by the NMR controller 508 and the computer 506 of the MRI system 500.

A more complete description of the structure and operation of the MRI system may be found in U.S. Pat. No. 6,025,717, assigned to the assignee of the present invention and incorporated by reference, herein.

The above embodiments are examples of antennas and magnetic resonance imaging systems in accordance with the present invention. It will be recognized by those skilled in the art that changes may be introduced to those embodiments without going beyond the scope of the invention, which is defined by the claims, below.

I claim:

1. An MRI antenna comprising:
   a first coaxial cable unit comprising a first inner conductor with first and second ends and a first outer conductor substantially surrounding the first inner conductor, the first outer conductor having first and second ends, the first coaxial cable unit having a concave curvature facing a first direction; and a second coaxial cable unit comprising a second inner conductor with first and second ends and a second outer conductor substantially surrounding the inner conductor, the second outer conductor having first and second ends, the second coaxial cable unit having a concave curvature fig a second direction opposite the first direction;

wherein:

the concave curvature of the first and second coaxial cable units generally face each other to define a region between the first and second coaxial cable units for receiving a body part, the first end of the first inner conductor is to be electrically connected to the first end of the second inner conductor through a first capacitor and the first end of the first outer conductor is to be electrically connected to the first end of the second outer conductor through a second capacitor, the second end of the first inner conductor and the second end of the second inner conductor are unconnected to each other and the second end of the first outer conductor and the second end of the second outer conductor being unconnected to each other, and first and second outer conductors provide an output of the antenna.

2. The MRI antenna of claim 1, wherein the first ends of the first and second inner conductors and the first ends of the first and second outer conductors are on opposite sides of the first and second coaxial cables.

3. The MRI antenna of claim 1, wherein the first inner and outer conductors are inductively coupled and the second inner and outer conductors are inductively coupled during operation.

4. The antenna of claim 3, wherein the coupling is tight or critical coupling.

5. The MRI antenna of claim 1, wherein the first and second coaxial cable units have portions adjacent to each other, for inductively coupling the first and second coaxial cable units during operation.

6. The MRI antenna of claim 5, wherein the coupling is tight or critical coupling.

7. The MRI antenna of claim 1, wherein the first and second coaxial cable units lie in first and second parallel planes, respectively.

8. The MRI antenna of claim 1, further comprising a third coaxial cable unit comprising a third inner conductor and a third outer conductor substantially surrounding the third inner conductor, the third coaxial cable unit being aligned with the second coaxial cable unit, and having a concave curvature in the same direction as the second coaxial cable unit;

the third inner conductor and the third outer conductor of the third coaxial cable unit being electrically connected to the second inner conductor and to the second outer conductor of the second coaxial cable unit, respectively, to form two circuits tuned to the same frequency.

9. The MRI antenna of claim 8, wherein the inner conductors in each coaxial cable unit are inductively coupled to the outer conductors of each coaxial cable unit.

10. The MRI antenna of claim 8, wherein the first, second and third coaxial cable units lie in first, second and third parallel planes, respectively, the first plane being between the second and third planes.

11. The MRI antenna of claim 10, wherein portions of the first and second coaxial cable units and portions of the first and third coaxial cable units are adjacent, for inductively coupling the first and second coaxial cable units and the first and third coaxial cable units during operation.

12. The MRI antenna of claim 11, wherein the inductive coupling is tight or critical coupling.

13. The MRI antenna of claim 8, further comprising a fourth coaxial cable comprising a fourth inner conductor and a fourth outer conductor substantially surrounding the fourth inner conductor, the fourth coaxial cable unit being aligned with the first coaxial cable unit and having a concave curvature in the same direction as the first coaxial cable unit;

the fourth inner conductor and the fourth outer conductor of the fourth coaxial cable unit being electrically connected to the first inner conductor and to the first outer conductor of the first coaxial cable unit, respectively, to form two circuits tuned to the same frequency.

14. The MRI antenna of claim 13, wherein the inner and outer conductors of each coaxial cable unit are inductively coupled during operation.

15. The MRI antenna of claim 14, wherein the coupling is tight or critical coupling.

16. The MRI antenna of claim 13, wherein the first, second, third and fourth coaxial cable units lie in first, second, third and fourth parallel planes, respectively, the first plane being between the second and third planes and the third plane being between the first and fourth planes.

17. The MRI antenna of claim 16, wherein portions of the first coaxial cable unit are adjacent to portions of the second and third coaxial cable units for inductively coupling the first coaxial cable unit to the second and third coaxial cable units and portions of the fourth coaxial cable unit are adjacent to portions of the third coaxial cable unit for inductively coupling the third and fourth coaxial cable units, during operation.

18. The MRI antenna of claim 17, wherein the inductive coupling is tight or critical coupling.

19. The MRI antenna of claim 13, further comprising a fifth coaxial cable comprising a fifth inner conductor and a fifth outer conductor substantially surrounding the fifth inner conductor, the fifth coaxial cable unit being aligned with the second and third coaxial cable units and having a concave curvature in the same direction as the second and third coaxial cable units;

the fifth inner conductor being electrically connected to the circuit comprising the second and third inner conductors and the fifth outer conductor being electrically connected to the circuit comprising the second and third outer conductors.

20. The MRI antenna of claim 19, wherein the inner and outer conductors of each coaxial cable unit are inductively coupled during operation.

21. The MRI antenna of claim 20, wherein the coupling is tight or critical coupling.

22. The MRI antenna of claim 19, further comprising a first pin connector for connecting the circuit comprising the inner conductors of the first and fourth coaxial able units to the circuit comprising the inner conductors of the second, third and fifth coaxial cable units and a second pin connector for connecting the circuit comprising the outer conductors of the first and fourth coaxial cable units to the circuit comprising the outer conductors of the second, third and fifth coaxial cable units.

23. The MRI antenna of claim 19, wherein the first, second, third, fourth and fifth coaxial cable units lie in first, second, third, fourth and fifth parallel planes, respectively, the first plane being between the second and third planes and the fourth plane being between the third and fifth planes.

24. The MRI antenna of claim 23, wherein portions of the first coaxial cable unit are adjacent to portions of the second and third coaxial cable units for inductively coupling the first coaxial cable unit to the second and third coaxial cable units for inductively coupling the fourth coaxial cable unit are adjacent to portions of the third and fifth coaxial cable unit for inductively coupling the fourth coaxial cable unit to the third and fifth coaxial cable units during operation.

25. The MRI antenna of claim 24, wherein the inductive coupling is tight or critical coupling.

26. An MRI antenna comprising:
first second and third coaxial cable units, each coaxial cable unit comprising inner and outer conductors, wherein each outer conductor substantially surrounds each inner conductor and the inner and outer conductors of each coaxial cable unit are inductively coupled during operation;
the first, second and third coaxial cable units lying in first, second and third parallel plants, respectively, the first plane being between the second and third planes and the first and third coaxial cable units being aligned;
the first second and third coaxial cable units having a concave curvature, wherein the curvature of the first and third coaxial cable units is in a first direction and the curvature of the seconds coaxial cable unit is in a second direction opposite the first direction, the first, second and third coaxial cable units defining a region for receiving a body part;
the second coaxial cable unit having portions adjacent to the first and third coaxial cable units, for inductively coupling the second coaxial cable unit to the first and third coaxial cable units, during operation;
the inner and outer conductors of the first and third coaxial cable units being electrically coupled to form respective circuits tuned to the same frequency;
the inner conductors of the first and third coaxial cable units being capacitively coupled to the inner conductor of the second coaxial cable unit through a single capacitive connection and the outer conductors of the first and third coaxial cable units being capacitively coupled to the outer conductor of the second coaxial cable unit through a single capacitive connection;
the antenna further comprising outputs from the coupled outer conductors of the first and third coaxial cable units and from the outer conductor of the second coaxial cable unit.

27. The MRI antenna of claim 26, wherein the inductive coupling between adjacent coaxial cable units is tight or critical coupling.

28. The MRI antenna of claim 26, wherein the inner conductors of each coaxial cable unit are inductively coupled to the outer conductor of each coaxial cable unit, respectively, during operation.

29. The MRI antenna of claim 28, wherein the coupling is tight or critical coupling.

30. An MRI antenna comprising:
first, second, third, fourth and fifth coaxial cable units, each coaxial cable unit comprising inner and outer conductors, wherein the outer conductor substantially surrounds the inner conductor and the inner and outer conductors of each coaxial cable unit are inductively coupled during operation;
the first, second, third, fourth and fifth coaxial cable units lying in first, second, third, fourth and fifth parallel planes, respectively, the first plane being between the third and fourth planes and the second plane being between the fourth and fifth planes;
the first and second coaxial cable units being aligned and the third, fourth and fifth coaxial cable units being aligned;
the first, second, third, fourth and fifth coaxial cable units each having a concave curvature, wherein the curvature of the first and second coaxial cable units is in a first direction and the curvature of the third, fourth and fifth coaxial cable units is in a second direction opposite the first direction, the first, second, third, fourth and fifth coaxial cable units defining a region for receiving a body part;
the first coaxial cable unit having portions adjacent to the third and fourth coaxial cable units for inductively coupling the first coaxial cable unit to the third and fourth coaxial cable units, during operation;
the second coaxial cable unit having portions adjacent to the fourth and fifth coaxial cable units for inductively coupling the second coaxial cable unit with the fourth and fifth coaxial cable units during operation;
the inner and outer conductors of the first and second coaxial cable units being electrically connected to form respective circuits tuned to a frequency and the inner and outer conductors of the third, fourth and fifth coaxial cable units being electrically connected to form respective circuits tuned to the frequency;
the inner conductors of the first and third coaxial cable units being capacitively coupled to the inner conductors of the third, fourth and fifth coaxial cable units through a single capacitive connection and the outer conductors of the first and second coaxial cable units being capacitively coupled to the outer conductors of the third, fourth and fifth coaxial cable units through a single capacitive connection; and
the antenna further comprising an output from the outer conductors of the first and third coaxial cable units and from the outer conductors of the third, fourth and fifth coaxial cable units.

31. The MRI antenna of claim 30, wherein the inductive coupling between adjacent coaxial cable units is tight or critical coupling.

32. The MRI antenna of claim 30, wherein the inner conductors of each coaxial cable unit are inductively coupled to the outer conductors of each coaxial cable unit, respectively.

33. The MRI antenna of claim 32, wherein the coupling is tight or critical coupling.

34. An MRI antenna, comprising:
a base for surrounding a body part, the base having an upper portion and a lower portion;
at least one upper coaxial cable unit comprising an inner and an outer conductor, the upper coaxial cable unit being supported by the upper portion of the base; and
at least one lower coaxial cable unit comprising an inner and an outer conductor, the lower coaxial cable unit being supported by the lower portion of the base,
the at least one upper coaxial cable unit having portions adjacent to the at least one lower coaxial cable unit for inductively coupling the upper and lower coaxial cable units during operation;
wherein the inner conductor of the at least one upper coaxial cable unit is capacitively connected to the inner conductor of the at least one lower coaxial cable unit through a single capacitive connection, the outer conductor of the at least one upper coaxial cable unit is capacitively connected to the outer conductor of the at least one lower coaxial cable unit through a single capacitive connection, and an output of the antenna is provided from the outer conductors of the at least one upper coaxial cable unit and from the at least one lower coaxial cable unit.

35. The MRI antenna of claim 34, wherein the inner and outer conductors of the at least one upper coaxial cable unit are electrically connected to the inner and outer conductors of the at least one lower coaxial cable unit through two pin connectors.

36. The MRI antenna of claim 34, wherein the inductive coupling between adjacent coaxial cable unit is tight or critical coupling.

37. The NU antenna of claim 34, wherein the inner conductors of each coaxial cable unit are inductively coupled to the outer conductors of each coaxial cable unit, respectively.

38. The MRI a of claim 37, wherein the coupling is tight or critical coupling.

39. An MRI antenna comprising:

a support;

first, second, third, fourth and fifth coaxial cable units supported by the support in first, second, third, fourth and fifth parallel planes, respectively, the first plane being between the third and fourth planes and the second plane being between the fourth and fifth planes, each coaxial cable unit comprising inner and outer conductors inductively coupled during operation;

each coaxial cable unit comprising generally parallel leg portions and a transverse portion connecting the leg portions, each coaxial cable unit being supported by the support such that the first and second coaxial cable units are aligned and the third, fourth and fifth coaxial cable units are aligned to define a region for receiving a body part;

wherein the leg portions of the first coaxial cable unit extend between the leg portions of the third and fourth coaxial cable units and the leg portions of the second coaxial cable unit extend between the leg portions of the fourth and fifth coaxial cable units for inductively coupling the first coaxial cable unit to the third and fourth coaxial cable unit and for inductively coupling the second coaxial cable unit to the third and fourth coaxial cable units during operation;

the inner conductors of the first and second coaxial cable units being electrically connected to form a circuit tunable to a frequency;

the outer conductors of the first and second coaxial cable units being electrically connected to form a circuit tunable to the frequency;

the inner conductors of the third, fourth and fifth coaxial cable units being electrically connected to form a circuit tunable to the frequency; and the antenna further comprising outputs from the circuit comprising the outer conductors of the first and second coaxial cable units and from the circuit comprising the outer conductors of the third, fourth and fifth coaxial cable units.

40. The MN antenna of claim 39, wherein the inductive coupling are tight or critical couplings.

41. The MRI antenna of claim 39, wherein the electrical connections between the inner conductors and the electrical connection between the outer conductors of the third, fourth and fifth coaxial cable units are parallel connections.

42. An MRI antenna comprising:

a support;

first, second, third, fourth and fifth coaxial cable units supported by the support in first, second, third, fourth and fifth parallel planes, respectively, the first plane being between the third and fourth planes and the second plane being between the fourth and fifth planes, each coaxial cable unit comprising inner and outer conductors inductively coupled during operation;

each coaxial cable unit comprising generally parallel leg portions and a transverse portion connecting the leg portions, each coaxial cable unit being supported by the support such that the first and second coaxial cable units are aligned and the third, fourth and fifth coaxial cable units are aligned, wherein the leg portions of the first coaxial cable unit extend between the leg portions of the third and fourth coaxial cable units and the leg portions of the second coaxial cable unit extend between the leg portions of the fourth and fifth coaxial cable units for inductively coupling the first coaxial cable unit to the third and fourth coaxial cable units and for inductively coupling the second coaxial cable unit to the third and fourth coaxial cable units during operation, respectively;

wherein each inner and outer conductor has a first and second end, the first end of each inner and outer conductor of each coaxial cable unit being on a first side of the antenna and the second end of each inner and outer conductor of each coaxial cable unit being on a second side of the antenna, opposite the first side; and the first end of the inner conductor of the first coaxial cable unit is directly electrically connected to the first end of the inner conductor of the second coaxial cable unit;

the first end of the outer conductor of the first coaxial cable unit is directly electrically connected to the first end of the outer conductor of the second coaxial cable unit;

the second end of the inner conductor of the first coaxial cable unit is electrically connected to the second end of the inner conductor of the second coaxial cable unit through a capacitor;

the second end of the outer conductor of the first coaxial cable unit is electrically connected to the second end of the outer conductor of the second coaxial cable unit through a capacitor;

the first ends of the inner conductors of the third, fourth and fifth coaxial cable units are directly electrically connected in parallel;

the first is of the outer conductors of the third, fourth and fifth coaxial cable units are directly electrically connected in parallel;

the second ends of the inner conductors of the third, fourth and fifth coaxial cable units are electrically connected in parallel through at least one capacitor;

the second ends of the outer conductors of the third, fourth and fifth coaxial cable units a electrically connected in parallel through at least one capacitor;

the electrically connected first ends of the inner conductors of the first and second coaxial cable units are electrically connected to the electrically connected first ends of the inner conductors of the third, fourth and fifth coaxial cable units through a capacitor; and the electrically connected second ends of the outer conductors of the first and second coaxial cable units are electrically connected to the electrically connected second ends of the outer conductors of the third, fourth and fifth coaxial cable units through a capacitor, providing an output of the antenna.

43. The MRI antenna of claim 42, wherein the inductive couplings arm tight or critical couplings.

44. A magnetic resonance imaging system comprising:

a receiver subsystem; and an antenna connected to the receiver system, the antenna comprising:
  a base for surrounding a body part;
  a first coaxial cable unit comprising an inner conductor and an outer conductor, and a second coaxial cable unit comprising an inner and an outer conductor, the first and second coaxial cable units being supported by the support to receive a body part therebetween;
  the first coaxial cable unit having portions adjacent to the second coaxial cable unit for inductively coupling the first and second coaxial cable units during operation;
  wherein the inner conductor of the first coaxial cable unit is capacitively connected to the inner conductor of the second coaxial cable unit through a single capacitive connection,
  the outer conductor of the first coaxial cable unit is capacitively connected to the outer conductor of the second coaxial cable unit through a single capacitive connection, and
  the outer conductors of the first and second coaxial cable units are connected to the receiver subsystem, through a capacitor.

45. An MRI transmitting antenna, comprising:

a base for surrounding a body part;

a first coaxial cable unit comprising an inner and an outer conductor, and a second coaxial cable unit comprising an inner and an outer conductor, the first and second coaxial cable units being supported by the support to define a region for receiving a body part;

the first coaxial cable unit having portions adjacent to the second coaxial cable unit for inductively coupling the first and second coaxial cable units during operation;

wherein the inner conductor of the first coaxial cable unit is capacitively connected to the inner conductor of the second coaxial cable unit through a single capacitive connection, the outer conductor of the first coaxial cable unit is capacitively connected to the outer conductor of the second coaxial cable unit through a single capacitive connection, and an input to the antenna is provided through the outer conductors of the first and second coaxial cable units.

46. A magnetic resonance imaging system, comprising:

a radio frequency transmitting subsystem; and a transmitting antenna connected to the radio frequency transmitting system, the antenna comprising:
  a base for surrounding a body part;
  a first coaxial cable unit comprising an inner and an outer conductor, and a second coaxial cable unit comprising an inner and an outer conductor, the first and second coaxial cable units being supported by the support to define a region for receiving a body part;
  the first coaxial cable unit having portions adjacent to the second coaxial cable unit for inductively coupling the first and second coaxial cable units during operation;
  wherein the inner conductor of the first coaxial cable unit is capacitively connected to the inner conductor of the second coaxial cable unit through a single capacitive connection,
  the outer conductor of the first coaxial cable unit is capacitively connected to the outer conductor of the second coaxial cable unit through a single capacitive connection, and
  the outer conductors of the first and second coaxial cable units are connected to the radio frequency transmitting system.

* * * * *